United States Patent
Chang

(10) Patent No.: US 7,003,684 B2
(45) Date of Patent: Feb. 21, 2006

(54) MEMORY CONTROL CHIP, CONTROL METHOD AND CONTROL CIRCUIT

(75) Inventor: Nai-Shung Chang, Taipei Hsien (TW)

(73) Assignee: VIA Technologies, Inc., Taipei Hsien (TW)

( * ) Notice: Subject to any disclaimer, the term of this patent is extended or adjusted under 35 U.S.C. 154(b) by 486 days.

(21) Appl. No.: 10/247,662

(22) Filed: Sep. 18, 2002

(65) Prior Publication Data

US 2003/0217243 A1     Nov. 20, 2003

Related U.S. Application Data

(60) Provisional application No. 60/368,664, filed on Mar. 27, 2002.

(30) Foreign Application Priority Data

May 24, 2002     (TW) ................. 91111026 A

(51) Int. Cl.
*G06F 13/14*     (2006.01)

(52) U.S. Cl. ............... 713/500; 713/503; 365/230.04; 365/194

(58) Field of Classification Search ............... 713/500, 713/503; 365/230.04, 194

See application file for complete search history.

(56) References Cited

U.S. PATENT DOCUMENTS

| 5,787,047 | A | | 7/1998 | Norris et al. ............... 365/230 |
| 5,881,009 | A | * | 3/1999 | Tomita ........................ 365/221 |
| 6,034,878 | A | | 3/2000 | Osaka et al. .................. 365/52 |
| 6,183,351 | B1 | * | 2/2001 | Aoki ........................... 451/60 |
| 6,314,046 | B1 | * | 11/2001 | Kamiya et al. ........ 365/230.04 |
| 6,446,158 | B1 | | 9/2002 | Karabatsos ..................... 711/5 |
| 6,501,700 | B1 | * | 12/2002 | Pascucci ................ 365/230.04 |
| 6,564,285 | B1 | * | 5/2003 | Mills et al. .................. 711/103 |
| 6,698,291 | B1 | * | 3/2004 | Yamamoto et al. ........... 73/620 |
| 2002/0125927 | A1 | | 9/2002 | Hofstra ........................ 327/158 |

FOREIGN PATENT DOCUMENTS

KR     1020010036202     5/2001

OTHER PUBLICATIONS

"Babel Fish-Übersetzung" English translation of BebelFish-Übersetzung from http://babelfish.altavista.comt/tr dated Aug. 16, 2004.

* cited by examiner

*Primary Examiner*—A. Elamin
(74) *Attorney, Agent, or Firm*—J.C. Patents

(57) ABSTRACT

A memory control chip, control method and control circuit. Instead of accessing a plurality of memory modules in a memory bank by referencing the same clocking signal, each memory module references a clocking signal having the same frequency but a slightly different preset phase so that the data within each memory module is accessed at a slightly different time. Ultimately, simultaneous switch output noise is greatly reduced and fewer power/ground pins are required in a package.

19 Claims, 4 Drawing Sheets

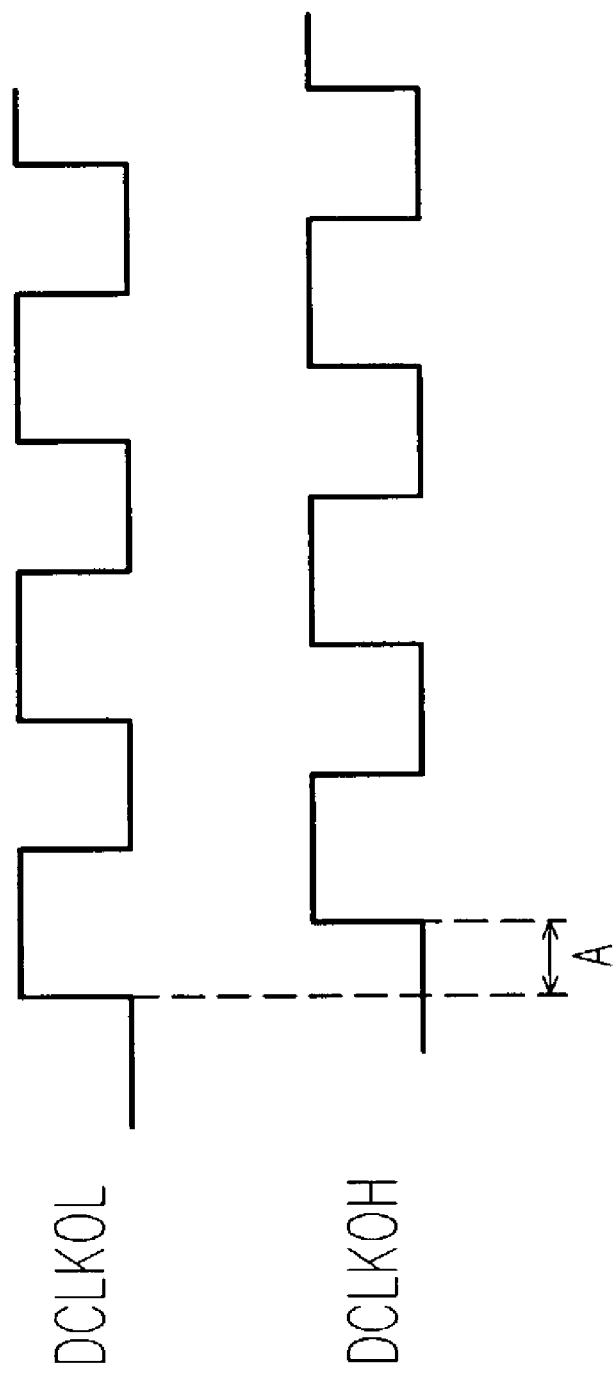

US 7,003,684 B2

MEMORY CONTROL CHIP, CONTROL METHOD AND CONTROL CIRCUIT

CROSS-REFERENCE TO RELATED APPLICATION

This application claims the priority benefit of U.S. provisional application titled "METHOD AND APPARATUS OF REDUCING NOISE IN ACCESSING 128BIT DDR" filed on Mar. 27, 2002, Ser. No. 60/368,664. All disclosures of this application is incorporated herein by reference. This application also claims the priority benefit of Taiwan application serial no. 91111026, filed May 24, 2002.

BACKGROUND OF THE INVENTION

1. Field of Invention

The present invention relates to a memory circuit. More particularly, the present invention relates to a memory control chip, control method and control circuit.

2. Description of Related Art

Most personal computer (PC) systems include a host board, an interface card and some peripheral devices. The host computer board is central to the operation of the computer system. Except for a central processing unit (CPU), memory control chip and slots for accommodating interface cards, the host computer board also has a plurality of memory module slots for inserting memory modules. According to system requirements, different types of memory modules may be inserted to the host board.

The most frequently used memories inside a personal computer includes synchronous dynamic random access memory (SDRAM) and double data rate dynamic random access memory (DDR SDRAM). In SDRAM, data access is triggered through the rising edge or the falling edge of a clocking signal. On the other hand, data access in DDR SDRAM is triggered through both the rising edge and the falling edge of the system clock so that DDR SDRAM has a data access rate doubles that of the SDRAM for the same clocking frequency.

At present, DDR SDRAM memory modules use memory module slots that adhere to the 184-lead CDEC standard. The number of data signaling leads provided by the standard is 64-bit wide and hence matches the 64-bit wide bus in the memory control chip. Therefore, each memory module can be defined as a memory bank and a batch of data 64-bit wide can be accessed at a time. To increase memory address space and reserve space for future expansion, a host board typically has an unequal number of memory module slots for plugging memory modules. Furthermore, memory modules plugged into different memory module slots often indicate memory modules belonging to a different memory bank.

FIG. 1 is a schematic block diagram of a conventional memory control circuit. The circuit in FIG. 1 includes a memory control chip 110, a clock buffer 140, a first memory module 120 and a second memory module 130. The first memory module 120 and the second memory module 130 are plugged into two memory module slots, which belong to different memory banks (not shown), so that data within the memory modules 120 and 130 can be accessed through the memory control chip 110. In FIG. 1, the number of data signaling leads (DATA) in the memory control chip 110 as well as the number of data signaling leads SD1 and SD2 in the first memory module 120 and the second memory module 130 are also 64. Hence, the memory control chip 110 is able to use a 64-bit wide data bus 115 to access data within those memory modules 120 and 130. The clock generator lead (DCLK0) in the memory control chip 110 is connected to the clock input terminal (CKI) of the clock buffer 140 for boosting the driving capacity of the clocking signal. The clock output terminal (ck01) of clock buffer 140 outputs a clocking signal to drive both the first memory module 120 and the second memory module 130 (the clock buffer 140 outputs a clocking signal capable of driving at most 4 banks of memory modules). Hence, clocking signals are transmitted to the first memory module 120 and the second memory module 130 as reference clock signals during a data access operation. The clock buffer 140 also has a clock feedback output terminal (CK02) for transmitting clocking signals back to a clock feedback input terminal (DCLKI) in the memory control chip 110. The memory control chip 110 also has a phase lock circuit (not shown) for adjusting the clocking phase of the signal transmitted from the clock signal output terminal (DCLKO). The memory modules on the memory module slots have 64-bit wide data signaling leads. Hence, when the clock generator lead (DCLKO) in the memory control chip 110 issues a clocking signal together with an address for accessing any one of the memory modules, a 64-bit data variation will appear on the data bus 115. Such variation on the data bus 115 may lead to the production of prodigious quantity of noise signals from the data signal leads (DATA) of the memory control chip, the so-called simultaneous switch output (SSO) noise. To reduce the noise, a large number of power/ground leads is set up close to the data signal leads (DATA) of the memory control chip 110. These power/ground leads increase the number of charge/discharge path when voltages at the data signal leads (DATA) vary. Consequently, the noise is controlled within an acceptable range.

With recent breakthroughs in semiconductor design, computational capability of a central processing unit has multiple fold improvements. Thus, width of buses from the memory control chip of a personal computer must increase to match the speed of execution of the central processing unit.

FIG. 2 is a block diagram of a conventional memory control circuit with a 128-bit wide bandwidth. The 128-bit wide data bus 155 receives signals from the memory module 162 and the memory module 164 with each memory module providing 64-bit of data signals. A host board having this type of circuit architecture requires an even number of memory modules. The circuit includes a memory control chip 150, a clock buffer 180, a third memory module 162 and a fourth memory module 164. The third memory module 162 and the fourth memory module 164 belong to the same memory bank 160 but plugged into separate memory module slots (not shown). The data signal bus leads (DATA) in the memory control chip 150 is 128-bit wide. Similarly, the sum of the number of data signal leads SD1 in the third memory module 162 and the number of data signal leads SD2 in the fourth memory module 164 is 128. Hence, the memory control chip 150 may access the data in the memory module 162 and 164 within the memory bank 160 simultaneously through the 128-bit data bus 155. The clock generator lead (DCLKO) in the memory control chip 150 is connected to the clock input terminal (CKI) of the clock buffer 180 for increasing the driving power of the clocking signal. The clock buffer 180 also has a clock output terminal (CK01) for outputting clock signals that drive both the third memory module 162 and the fourth memory module 164. Hence, clocking signals can be transmitted to the third memory module 162 and the fourth memory module 164 to serve as reference clock signals during a data access operation. The clock feedback output terminal (CK02) of the clock buffer 180 also transmits a clocking signal to the clock feedback input terminal (DCLKI) of the memory control chip 150 for adjusting the clocking phase of the signal transmitted from the clock generator lead (DCLKO).

For the newer DDR SDRAM memory module having a 128-bit wide data bus, each data access operation may result in a maximum change of 128 data bits in the data bus 155. With so many bit line changes concurrently, noise created at the data signal leads (DATA) of the memory control chip 150 will be considerably more than the transition of just 64 data bits. Thus, to reduce the noise that results from accessing 128 bits of data, the number of power/ground terminals set up close to the data signal leads (DATA) must be increased. However, the memory control chip is often enclosed within a 37.5 mm by 37.5 mm package to reduce production cost. Due to a limitation in pin positions for this type of package, the number of power/ground leads is virtually fixed. Yet, without additional power/ground leads in the package, the noise problem is going to aggravate.

SUMMARY OF THE INVENTION

Accordingly, one object of the present invention is to provide a memory control chip, control method and control circuit capable of reducing noise under the constraint of having only a few power/ground leads.

To achieve these and other advantages and in accordance with the purpose of the invention, as embodied and broadly described herein, the invention provides a memory control chip for accessing a plurality of memory modules within a memory bank. The memory control chip includes groups of data signal leads and a plurality of clock generator leads. Each group of data signal leads is able to connect with a group of data signal leads in one of the memory modules. The clock generator leads output corresponding clocking signals to the respective clock input lead of each memory module. All clocking signals have the same frequency but differ from each other by a preset phase.

This invention also provides a memory control method for controlling a plurality of memory modules within a memory bank. First, groups of data signal leads are provided on a chip. Each group of chip data signal leads is connected to a group of data signal leads of the corresponding memory module. A plurality of clocking signals is transmitted to the clock input leads of each memory module so that each memory module may access data according to a corresponding clocking signal. All the clocking signals have the same frequency but differ from each other by a preset phase. According to the clocking signals, the chip data signal leads accesses data through the group of data signal leads of each memory module sequentially.

This invention also provides a memory control circuit that includes a plurality of memory modules and a memory control chip. Each memory module has a clock input lead and a group of data signal leads. The memory modules belong to a memory bank. The memory control chip has groups of data signal leads. Each group of data signal leads is connected to a group of data signal leads in each memory module. The memory control chip also has a plurality of clock generator leads for transmitting clocking signals to the clock input lead of each memory module. All the clocking signals have identical frequency but differs from each other by a preset phase.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIG. 4 is a timing diagram of the clocking signals used in this invention.

DESCRIPTION OF THE PREFERRED EMBODIMENTS

Figure 1:
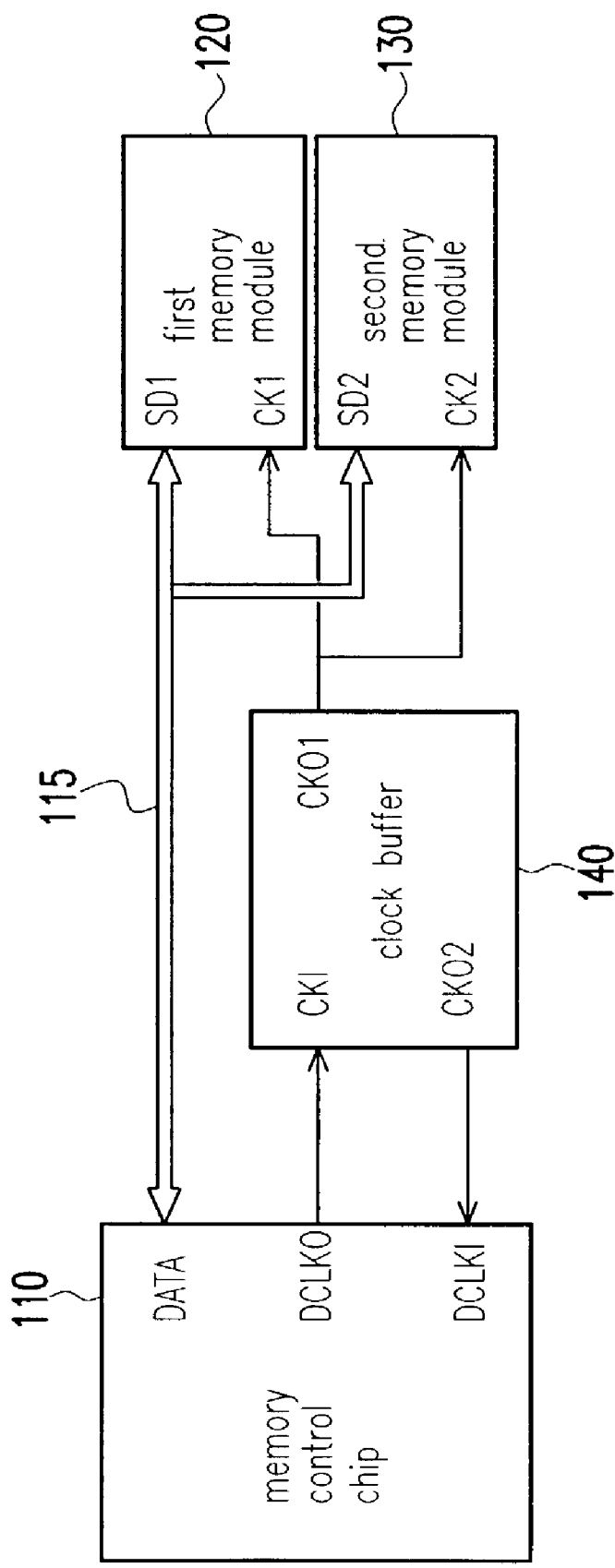
FIG. 1 is a block diagram of a conventional memory control circuit.
Figure 2:
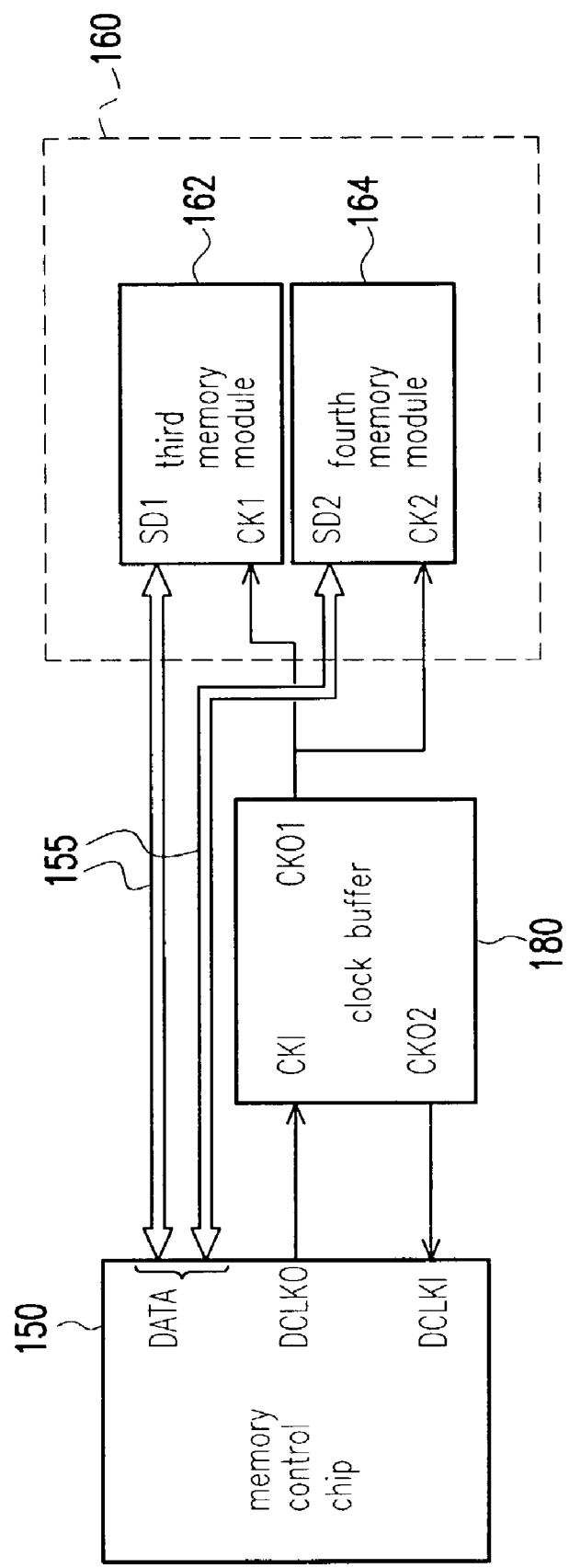
FIG. 2 is a block diagram of a conventional memory control circuit with a 128-bit wide bandwidth.

Reference will now be made in detail to the present preferred embodiments of the invention, examples of which are illustrated in the accompanying drawings. Wherever possible, the same reference numbers are used in the drawings and the description to refer to the same or like parts.

Figure 3:
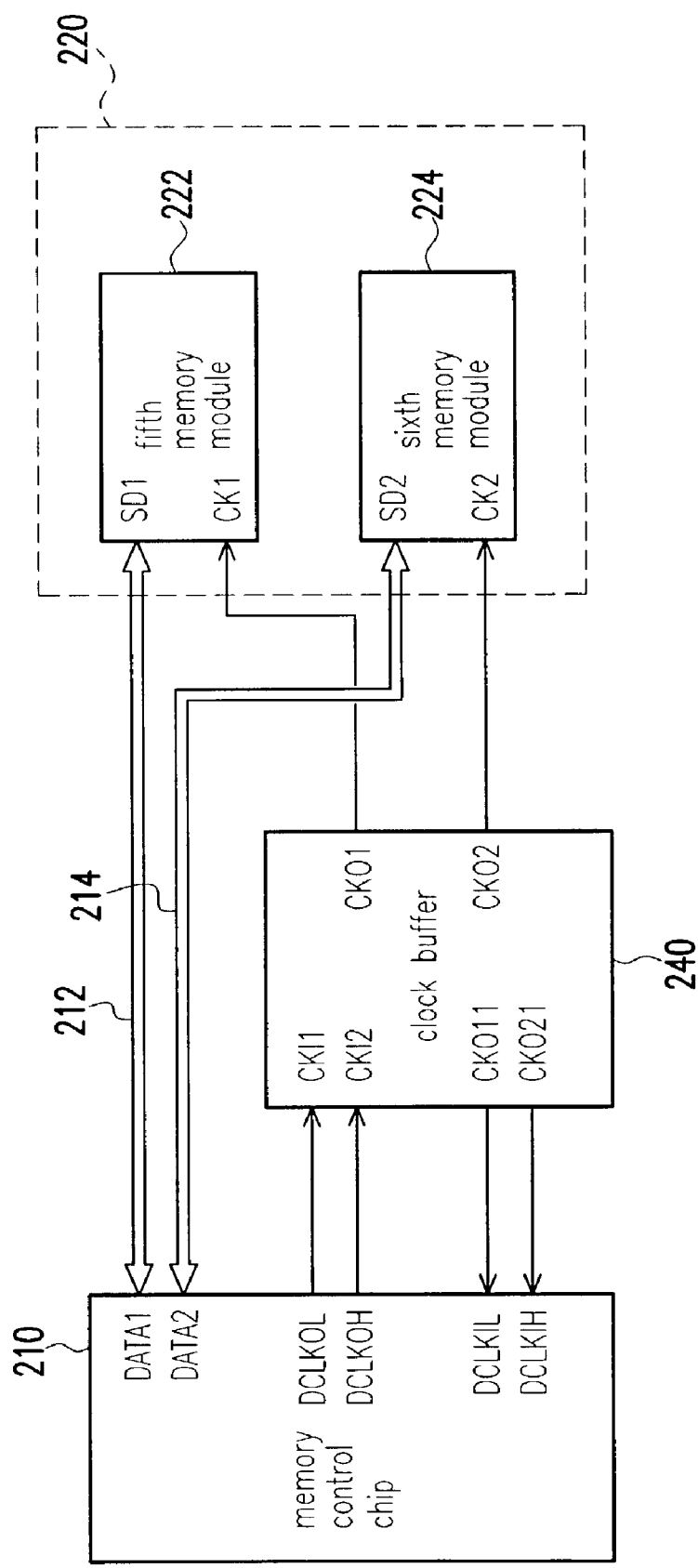
FIG. 3 is a block diagram of a memory control circuit according to one preferred embodiment of this invention.

FIG. 3 is a block diagram of a memory control circuit with a 128-bit data bus architecture according to one preferred embodiment of this invention. As shown in FIG. 3, the circuit includes a memory control chip 210, a clock buffer 240, a fifth memory module 222 and a sixth memory module 224. Both the fifth memory module 222 and the sixth memory module 224 belong to a memory bank 220 but plugged into separate memory module slots (not shown).

The data signal leads (DATA1 and DATA2) of the memory control chip 210 are 128-bit wide. The data signal leads (SD1 and SD2) of the fifth memory module 222 and the sixth memory module 224 are 128-bit wide. So, the memory control chip 210 can use a 128-bit wide data bus to access data within the memory modules 222 and 224 of the memory bank 220. The first group of data signal leads (DATA1) is connected to a first group of data leads (SD1) of the fifth memory module 222 and data is accessed through a 64-bit wide first data bus 212. Similarly, the second group of data signal leads (DATA2) is connected to a second group of data leads (SD2) of the sixth memory module 224 and data is accessed through a 64-bit wide second data bus 214.

As shown in FIG. 3, the first clock generator lead (DCLKOL) of the memory control chip 210 outputs a first clocking signal and the second clock generator lead (DCLKOH) outputs a second clocking signal. The first and the second clocking signal are transmitted to the first clock input terminal (CKI1) and the second clock input terminal (CKI2) of the clock buffer 240 for enhancing the driving capacity of the clocking signals. The first clock output terminal (CK01) and the second clock output terminal (CK02) of the clock buffer 240 output the enhanced first and second clocking signals to the clock input lead (CK1) of the fifth memory module 222 and the clock input lead (CK2) of the sixth memory module 224 respectively. Thus, the fifth memory module 222 and the sixth memory module 224 may separately reference the first clocking signal and the second clocking signal in data accessing operations.

The first clock feedback output terminal (CKO11) and the second clock feedback output terminal (CKO12) of the clock buffer 240 return a first feedback clocking signal and a second feedback clocking signal to the first clock feedback input terminal (DCLKIL) and the second clod feedback input terminal (DCLKIH) of the memory control chip 210 respectively. The feedback clocking signals are references for adjusting the clocking signals output from the first clock generator lead (DCLKOL) and the second clock generator lead (DCLKOH).

Because the number of power/ground leads is constrained by the 37.5 mm by 37.5 mm package in the memory control chip, the first clocking signals from the first clock generator lead (DCLKOL) and the second clocking signals from the second clock generator lead (DCLKOH) (both having an identical cycle time) are transmitted with a preset phase difference (as shown in FIG. 4, a phase difference of A exists between the clocking signals submitted by the first clock generator lead (DCLKOL) and the second clock generator lead (DCLKOH)).

In other words, the fifth memory module 222 and the sixth memory module 224 reference the first clocking signal and the second clocking signal separately. Hence, the first data signals 212 and the second data signals 214 are accessed by the memory control chip 210 at different times. Since each data access operation only varies at most 64 bits of data (either the first data bus 212 or the second data bus 214 is activated), fewer power/ground leads are required and the simultaneous switch output (SSO) of the 64 bit data variation are eliminated at two different timing intervals. That means, the amount of noise due to simultaneous switch output (SSO) is greatly reduced and there is no need to add extra power/ground leads to eliminate data variation resulting from a simultaneous 128-bit variation.

Obviously, the number of groups of data signal leads and the number of clock generator leads of the memory control chip 210 are not limited to two. As long as the bit width of the memory control chip is different from the conventional, the clock generator leads may be adjusted to generate clocking signals to control the data signal leads for accessing data. In the design of preset phase difference (phase A), using a DDR DRAM as an example, data access is activated through the rising and the falling edge of a clocking signal. Hence, the preset phase difference (phase A) must be controlled within half a cycle such as a quarter (¼) cycle or an eighth (⅛) cycle, preferably a quarter cycle. Because in a quarter cycle the first data signal 212 and the second data signal 214 has the biggest data variation interval, SSO noise can be controlled within a definite range.

In addition, if the number of memory modules is few, the first clock generator lead (DCLKOL) may connect directly to the clock input lead (CK1) of the fifth memory module 222. Similarly, the second clock generator lead (DCLKOH) may connect directly to the clock input lead (CK2) of the sixth memory module 224. With this arrangement, two clocking signals having a preset phase difference also can be used to access the two memory modules within a memory bank.

According to this embodiment, the first clocking signal and the second clocking signal has, for example, a frequency of 133 MHz or 166 MHz. When the first clocking signal and the second clocking signal are set to operate at 133 MHz, the data transmission rate on the first data bus 212 and the second data bus 214 is 266 MHz. If the preset phase difference is set to ⅛$^{th}$ cycle of the first clocking signal, noise can be controlled within a desired range. When the first clocking signal and the second clocking signal are set to operate at 166 MHz, the data transmission rate on the first group of data signal leads (DATA1) and the data transmission rate on the second group of data signal leads (DATA2) are 333 MHz. Similarly, if the preset phase difference is set to ¼$^{th}$ cycle of the first clocking signal, noise can be controlled within a desired range.

In conclusion, this invention provides a memory control chip, control method and control circuit that splits up data bus that references an identical clocking signal into data buses that reference clocking signals with a difference phase. In this manner, the invention has at least the following advantages:

1. The extent of simultaneous data variation is reduced and hence the magnitude of the SSO noise is lowered.

2. Fewer power/ground leads are required to combat noise and hence manufacturing cost is reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A memory control chip for accessing a plurality of memory modules within a memory bank, comprising:
    groups of data signal leads, wherein each group of data signal leads connects with a group of data signal leads in the corresponding memory module;
    a plurality of clocking generator leads each outputting a clocking signal to a clock input lead of the corresponding memory module;
    wherein all clocking signals have the same frequency but differ from each other by a preset phase.

2. The memory control chip of claim 1, wherein the memory control chip further includes a clock buffer connected to the clock generator leads and the clock input leads of the memory modules for enhancing the driving capacity of the clocking signal.

3. The memory control chip of claim 2, wherein the clock buffer has a plurality of clock feedback output terminals that connect with respective clock feedback input terminals in the memory control chip for adjusting phase of the clocking signals.

4. The memory control chip of claim 1, wherein the total number of memory modules is two.

5. The memory control chip of claim 1, wherein the preset phase is ¼ cycle of the clocking signal.

6. The memory control chip of claim 1, wherein the preset phase is ⅛ cycle of the clocking signal.

7. The memory control chip of claim 1, wherein each group of data signal leads in the memory control chip is 64-bit wide.

8. The memory control chip of claim 1, wherein the data signal leads in each memory module is 64-bit wide.

9. A memory control method for controlling a plurality of the memory modules within a memory bank, comprising:
    providing groups of chip data signal leads with each group of chip data signal leads connecting with a group of data signal leads in the corresponding memory module;
    providing a plurality of clocking signals with each clocking signal transmitted to a clock input lead of the corresponding memory module so that data within each memory module can be accessed according to the clocking signal, wherein all the clocking signals have the same frequency but differ from each other by a preset phase; and
    using the groups of chip signal leads to access sequentially the data within each memory module according to clocking signals.

10. The memory control method of claim 9, wherein the number of memory modules is two.

11. The memory control method of claim 9, wherein the preset phase is ¼ of a clocking cycle.

12. The memory control method of claim 9, wherein the preset phase is ⅛ of a clocking cycle.

13. The memory control method of claim 9, wherein each group of chip data signal leads is 64-bit wide.

14. The memory control method of claim 9, wherein each group of data signal leads in a memory module is 64-bit wide.

15. A memory control circuit, comprising:
a plurality of memory modules each having a clock input lead and a group of data signal leads, wherein the memory modules belong to a memory bank; and
a memory control chip having groups of data signal leads with each group of data signal leads connected to a group of data signal data leads in the corresponding memory module and a plurality of clock generator leads that outputs a plurality of clocking signals to the clock input lead of each memory module;
wherein all clocking signals have the same frequency but differ from each other by a preset phase.

16. The memory control circuit of claim 15, wherein the circuit further includes a clock buffer connected to the clock generator leads and the clock input lead of the memory module for enhancing the driving power of the clocking signals.

17. The memory control circuit of claim 16, wherein the clock buffer has a plurality of clock feedback output terminals that connect with respective clock feedback input terminals in the memory control chip for adjusting phase of the clocking signal.

18. The memory control circuit of claim 15, wherein each group of data signal leads in the memory control chip is 64-bit wide.

19. The memory control circuit of claim 15, wherein the data signal leads in each memory module is 64-bit wide.

* * * * *